US007123232B1

(12) United States Patent
Edwards

(10) Patent No.: US 7,123,232 B1
(45) Date of Patent: Oct. 17, 2006

(54) ACTIVE MATRIX ARRAY DEVICES

(75) Inventor: Martin J. Edwards, Crawley (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 317 days.

(21) Appl. No.: 09/614,154

(22) Filed: Jul. 11, 2000

(30) Foreign Application Priority Data

Jul. 29, 1999 (GB) .................................. 9917677.8

(51) Int. Cl.
G09G 3/36 (2006.01)
(52) U.S. Cl. ........................... 345/98; 345/87; 345/99; 345/100; 345/204; 345/205
(58) Field of Classification Search ................. 345/92, 345/87–89, 98–100, 50–52, 55–60, 30, 31–33, 345/42, 51, 59, 67, 103, 204–206, 48, 75–81, 345/82, 564, 568, 572–574; 341/144, 141, 341/100, 101; 348/249, 294–324, 332
See application file for complete search history.

(56) References Cited

U.S. PATENT DOCUMENTS

| | | | | |
|---|---|---|---|---|
| 4,890,101 | A | | 12/1989 | Carlson ....................... 340/811 |
| 5,021,774 | A | * | 6/1991 | Ohwada et al. ................ 345/90 |
| 5,325,442 | A | | 6/1994 | Knapp ............................ 382/4 |
| 5,510,807 | A | * | 4/1996 | Lee et al. .................... 345/103 |
| 5,589,847 | A | * | 12/1996 | Lewis .......................... 345/87 |
| 5,751,279 | A | * | 5/1998 | Okumura ..................... 345/204 |
| 5,892,493 | A | * | 4/1999 | Enami et al. .................. 345/94 |
| 6,049,321 | A | * | 4/2000 | Sasaki ......................... 345/100 |
| 6,111,557 | A | * | 8/2000 | Koyama et al. ............. 345/100 |
| 6,144,426 | A | | 11/2000 | Yamazaki et al. ............. 349/95 |
| 6,166,715 | A | * | 12/2000 | Chang et al. ................ 345/100 |
| 6,255,705 | B1 | * | 7/2001 | Zhang et al. ................ 257/290 |
| 6,256,024 | B1 | * | 7/2001 | Maekawa .................... 345/205 |
| 6,281,891 | B1 | * | 8/2001 | DaCosta et al. ............. 345/206 |
| 6,326,958 | B1 | * | 12/2001 | Gorny et al. ................ 345/204 |
| 6,380,917 | B1 | * | 4/2002 | Matsueda et al. ........... 345/210 |

(Continued)

FOREIGN PATENT DOCUMENTS

EP 0569090 A1 11/1993

(Continued)

OTHER PUBLICATIONS

"Fully Integrated Poly-Si TFT CMOS Drivers for Self-Scanned Light Valve", by Y. Nishihara et al, SID 92 Digest, pp. 609-612.

Primary Examiner—Richard Hjerpe
Assistant Examiner—Leonid Shapiro

(57) ABSTRACT

An active matrix array device, such as an AMLCD, has an array of matrix elements (10) addressed via sets of address conductors (14, 16). An address circuit (35) connected to one set (16) comprises a multiplexing circuit (31) integrated on the same substrate (25) as the matrix elements which has a plurality of signal bus lines (33), the one set of address conductors being organized in groups with each conductor in a group being associated with a respective and different signal bus line and the groups being addressed in sequence. Each signal bus line is connected to a respective signal processing circuit (42), e.g. a D/A converter or sample and hold circuit in the case of an AMLCD, which is also integrated on the substrate. To avoid problems in use due to the manner of fabrication of these circuits and the operation of the multiplexing circuit, the address circuit is arranged so that the individual signal processing circuits associated with adjacent column conductors are located close together on the substrate.

5 Claims, 3 Drawing Sheets

U.S. PATENT DOCUMENTS

| | | | |
|---|---|---|---|
| 6,380,920 B1 * | 4/2002 | Ozawa | 345/100 |
| 6,384,806 B1 * | 5/2002 | Matsueda et al. | 345/691 |
| 6,411,273 B1 * | 6/2002 | Nakamura et al. | 435/232 |
| 6,507,332 B1 * | 1/2003 | Kuwabara et al. | 345/103 |

FOREIGN PATENT DOCUMENTS

| WO | WO9927653 | 6/1999 |
|---|---|---|

\* cited by examiner

ACTIVE MATRIX ARRAY DEVICES

TECHNICAL FIELD OF THE INVENTION

The present invention relates generally to active matrix array devices.

BACKGROUND OF THE INVENTION

The present invention relates to an active matrix array device comprising an array of individually addressable matrix elements, first and second sets of crossing address conductors connected to the matrix elements, the array of matrix elements and the sets of address conductors being carried on a substrate, and an addressing circuit connected to the sets of row and column conductors for addressing the matrix elements and comprising a multiplexing circuit integrated on the substrate which is connected to the first set of conductors and has a plurality, n, of signal bus lines, the address conductors of the first set being arranged in a series of groups with each group comprising n successive address conductors and the multiplexing circuit being arranged to couple sequentially each group of address conductors to the signal bus lines with each address conductor in a group being coupled to a respective one of the bus lines, the addressing circuit further including a respective signal processing circuit connected to each bus line.

The matrix array device may, for example, be an active matrix liquid crystal (LC) display device. Such a device typically comprises an array of liquid crystal display elements each of which is connected to the output of a respective TFT (thin film transistor) to which gating (selection) and data (video information) signals are supplied by respective raw and column conductors. The addressing circuit consists of a row drive circuit connected to the row conductors for applying a gating signal to each row conductor in sequence to turn on the TFTs of each row of display elements in turn in respective row address periods and a column drive circuit connected to the set of column conductors for applying data signals to the column conductors in synchronism with scanning of the row conductors whereby the display elements of a selected row are charged via their respective TFTs to a level dependent on the value of the data signal existing on their associated column conductors to produce a required display effect. The TFTs usually comprise either amorphous silicon (a-Si) TFTs or polysilicon TFTs.

For convenience of manufacture and compactness, parts of the row and/or column drive circuits can be integrated on the substrate carrying the TFTs of the display elements peripherally of the display element array using the same large area electronics technology as that employed for the active matrix circuitry of the array with the circuitry of the drive circuit being fabricated simultaneously and similarly comprising TFTs, conductor lines—, etc. Due to limitations in operational performance of the TFTs and the kinds of circuit possible when using TFTs, the column drive circuit is customarily provided in the form of a simple multiplexing circuit, examples of which are described in U.S. Pat. No. 4,890,101, and the paper entitled "Fully Integrated Poly-Si TFT CMOS Drivers for Self-Scanned Light Valve" by Y. Nishihara et al in SID 92 Digest, pages 609–612. The operation of the column drive circuit is based on a multiplexing technique in which the video information (data) is sequentially transferred via multiplexing switches from a plurality of video input bus lines, to which video information is applied simultaneously, to corresponding groups or blocks of column conductors in the display with each column conductor in a group being connected via a multiplexer switch to a different video input line.

Commonly in polysilicon TFT display devices having an integrated column drive circuit this circuit is of an analog multiplexing type comprising groups of multiplexing switches, in the form of TFTs or CMOS gates, a set of video signal bus lines and a control circuit (normally comprising a shift register) which controls the operation of the multiplexer switches. Groups of video samples, constituting data, taken from an input video signal are applied to the video bus lines and the data is then transferred to corresponding groups of column conductors in the display array during a video line period, which corresponds to a row address period.

In known kinds of these display devices, the video information applied to the video bus lines is generated using external signal processing circuits (i.e. separate to the integrated multiplexing circuit), one such circuit being provided for each respective bus line, and which may consist of sample and hold circuits or digital to analog (D/A) converters.

It would be advantageous for additional circuit components of the address circuitry to be integrated on the device substrate in similar manner to the multiplexing circuit for example using TFTs etc formed by the same thin film technology employed for the active matrix array. The circuit components could then be fabricated simultaneously with the active matrix array thereby simplifying manufacture and reducing cost. Such integration would also lead to a more compact arrangement and reduce the number of external connections required.

SUMMARY OF THE INVENTION

It is one object of the present invention to provide an active matrix array device with improvement in this respect.

According to the present invention, there is provided an active matrix array device of the kind described in the opening paragraph which is characterised in that the signal processing circuits associated with the bus lines are integrated as respective circuit blocks on the device substrate with the individual signal processing circuit blocks associated with adjacent column conductors being located close together on the device substrate.

The active matrix array of the invention thus includes additional addressing circuitry components, i.e. the signal processing circuits, which are integrated, together with the multiplexing circuit, on the substrate of the device. The invention also entails arranging the column conductor addressing circuitry in a certain-manner. As a result, potential operational problems which could be caused by the nature of this integrated circuitry are avoided or at least reduced. In this respect, the invention stems in part from a recognition that operational problems can result due to deficiencies in the behavioral characteristics of circuit elements when using thin film circuit components, such as TFTs and capacitors, and thin film conductor interconnections for such purposes. In large area, thin film technology devices, the operational characteristics of individual thin film elements such as TFTs will normally be similar where the elements are formed physically close together but can vary significantly in the case of elements formed further apart due, for example, to slight variations over the area of the device in the thicknesses of individual deposited layers. If, therefore, the n signal processing circuits associated with the n signal bus lines were arranged simply juxtaposed in a line in and ordered in a manner corresponding to the order of the bus lines, and column, conductors with which they are respectively associated with successive bus lines supplying successive column conductors, i.e. with the first, second, third etc circuits connected to respectively the first, second, third etc bus lines, and thus the first, second, third etc column conductors in a group, the operational characteristics of the signal processing circuits associated with the first and last column conductors in a group can vary significantly. Thus in the case for example of the device comprising an active matrix LC display device, with the signal processing circuits comprising, for example, D/A converter circuits, then the variation in output voltage provided by the first and last converters to their respective bus lines, associated with the first and last column conductors in a group, will likely be the greatest due to them being the furthest apart on the substrate. Bearing in mind that the last column conductor in one group is adjacent the first column conductor in the succeeding group, then the output voltage signals generated by the first and last converters will appear on adjacent column conductors at regular intervals over the array and differences in the voltages applied to each adjacent pair will produce display non-uniformities in the nature of periodic, highly visible, steps in brightness across the display. By arranging the circuitry according to the invention, therefore, the visibility of the effect of converter circuit output variations is significantly reduced.

Preferably, the order in which the signal processing circuit blocks are arranged physically on the device substrate is different to the physical order of the signal bus lines to which they are respectively connected.

While the invention is particularly attractive for use in active matrix display devices, and especially AMLCDs, the technique can be applied to similar advantage in other kinds of active matrix array devices. For example, it is envisaged that the invention can be used in active matrix sensing array devices such as image sensing devices as described in EP-A-0569090 (PHB 33792) and fingerprint sensing devices as described in U.S. Pat. No. 5,325,442 (PHB 33628) and the like. These devices similarly comprise an array of elements addressed via sets of row and column conductors. The elements comprise light sensing or capacitive sensing elements and in operation each element provides an output signal, in the form of an electrical charge, along an associated address conductor of one set to which a sense amplifier is connected. The conductors of the one set are preferably connected via a multiplexing circuit to a set of sense amplifiers. In accordance with the present invention, therefore, the multiplexing circuit and the sense amplifier circuits, constituting the aforementioned signal processing circuits, can be integrated on the same substrate as the sensing element array similarly using thin film technology and with the sense amplifiers arranged physically on the substrate so as to reduce the effect of variations in voltages etc in the individual sense amplifier circuits caused by differences in the operational characteristics of thin film elements in these circuits when spaced widely apart on the substrate.

BRIEF DESCRIPTION OF THE DRAWINGS

Embodiments of active matrix array devices in accordance with the invention will now be described, by way of example, with reference to the accompanying drawings, in which:—

FIG. 2 illustrates schematically the circuit of a typical example of multiplexer circuit as used in active matrix array devices such as AMLCDs and the like;

It will be appreciated that the figures are merely schematic and have not been drawn to scale. The same reference numbers are used throughout the figures to indicate the same or similar parts.

DETAILED DESCRIPTION OF THE PRESENTLY PREFERRED EMBODIMENT

Figure 1:
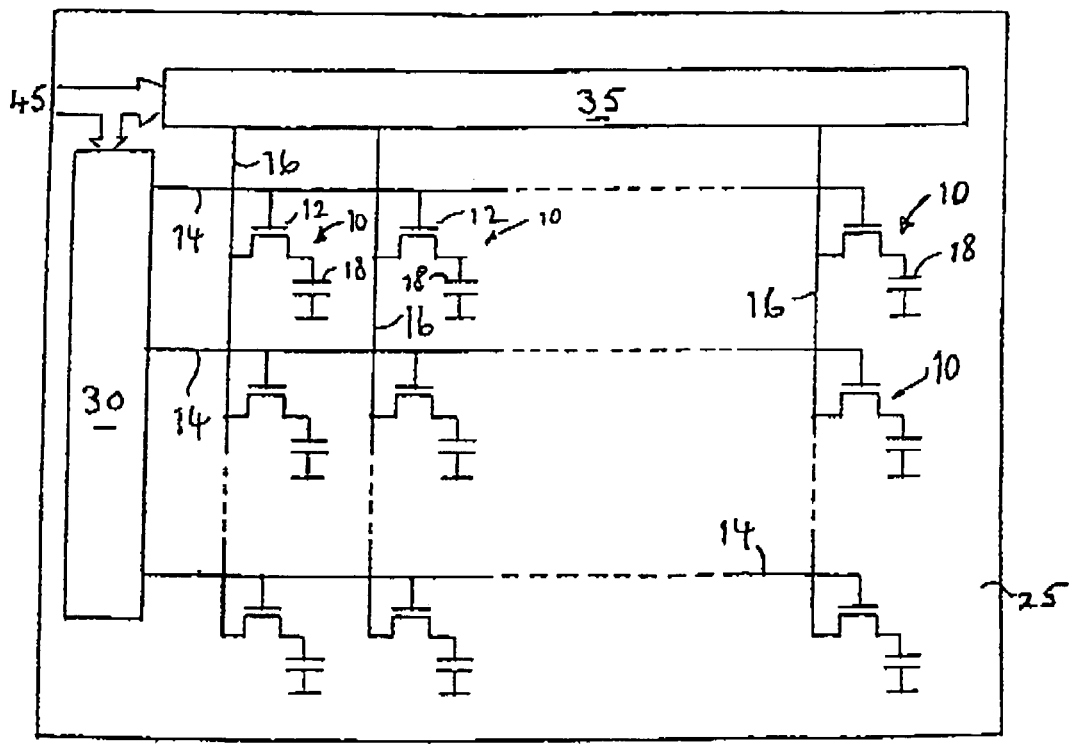
FIG. 1 is a simplified schematic circuit diagram of an embodiment of active matrix LC display device according to the invention.

Referring to FIG. 1, the active matrix LC display device (AMLCD) comprises a row and column array of individually operable liquid crystal display elements 10. The display elements each have an associated TFT 12 acting as a switching device and are addressed by peripheral addressing circuitry via sets of row and column address conductors 14 and 16 and comprising a row drive circuit 30 and a column drive circuit 35 connected-respectively to the sets of row and column conductors. Only a few typical display elements are shown for simplicity but in practice there would normally be at least several hundred rows and columns of such elements. The drain of a TFT 12 is connected to a respective display element electrode 18 situated adjacent the intersection of respective row and column address conductors, while the gates of all the TFTs associated with a respective row of display elements 10 are connected to the same row address conductor 14 and the sources of all the TFTs associated with a respective column of display elements are connected to the same column address conductor 16. The sets of row and column address conductors 14, 16, the TFTs 12, and the picture element electrodes 18 are all carried on the same insulating substrate 25, for example of glass, and fabricated in conventional manner using known thin film technology involving the deposition and photolithographic patterning of various conductive, insulating and semiconductive layers. A second glass substrate, (not shown) carrying a continuous transparent electrode common to all display elements in the array is arranged spaced from the substrate 25 and the two substrates are sealed together around the periphery of the display element array and separated by spacers to define an enclosed space in which liquid crystal material is contained. Each display element electrode 18 together with an overlying portion of the common electrode and the liquid crystal material therebetween defines a light-modulating capacitive display element.

Both the general structure and operation of this device follow conventional practice. Scanning (gating) signals are applied to each row address conductor 14 in turn by the row driver circuit 30, comprising for example a digital shift register, and data signals are applied to the column conductors 16, in synchronisation with the gating signals, by the column drive circuit 35. Upon each row conductor being supplied with a gating signal, the TFTs 12 connected to that row conductor are turned on causing the respective display elements to be charged according to the level of the data signal then existing on their associated column conductors. Upon termination of the gating signal at the end of the respective row address period, corresponding for example to the line period of an applied video signal, the associated TFTs are turned off for the remainder of the field period in order to isolate electrically the display elements and ensure the applied charge is stored on the LC capacitance to maintain their display outputs until they are addressed again in a subsequent field period.

The row and column drive circuits 30 and 35 are both integrated on the substrate 25 with their circuitry being formed simultaneously with the fabrication active matrix array using the same thin film technology and similarly comprising TFTs, conductor lines, capacitors, etc. The row drive circuit 30 is of convention form, comprising for example a simple shift register circuit whose operation is controlled by timing signals provided by an external timing and control circuitry (not shown) to which digital video data is supplied from a suitable source.

The digital video information (data) signals are supplied by the timing and control circuitry to the column drive circuit 35 which operates to apply to the set of conductors 16 analog voltage signals derived from this data in parallel for each row of display elements in turn so as to produce the desired display effects from the displays element in each row according to the supplied data.

As is common in AMLCDs having partly integrated column drive circuitry, particularly devices employing polysilicon TFTs, the column drive circuit 35 is of the analog multiplexing kind and has an integrated multiplexing circuit providing a respective output for each column conductor 16. A typical example of a simple known form of multiplexing circuit, 31, is illustrated, in part, in FIG. 2.

The general operation of such a circuit is based on a multiplexing technique in which analog video information is sequentially transferred from a plurality of video input bus lines supplied in parallel with video data to corresponding groups of column address conductors in the display device. The video information is transferred via multiplexing switches, 32, which may consist of NMOS TFTs, PMOS TFTs or CMOS transmission gates. The switches, which each constitute an output of the circuit associated with a respective column conductor, are operated in groups and when a group of switches is turned on the corresponding columns are charged according to the data signal voltage levels then existing on the respective associated video bus lines. When the switches turn off the voltages on the column conductors are stored on the capacitance of the column conductors and any additional storage capacitors that may be connected in parallel with them. During a respective video line, row address, period each group of multiplexing switches is turned on in sequence until all of the columns of display elements have been charged with the appropriate video information.

Figure 2:
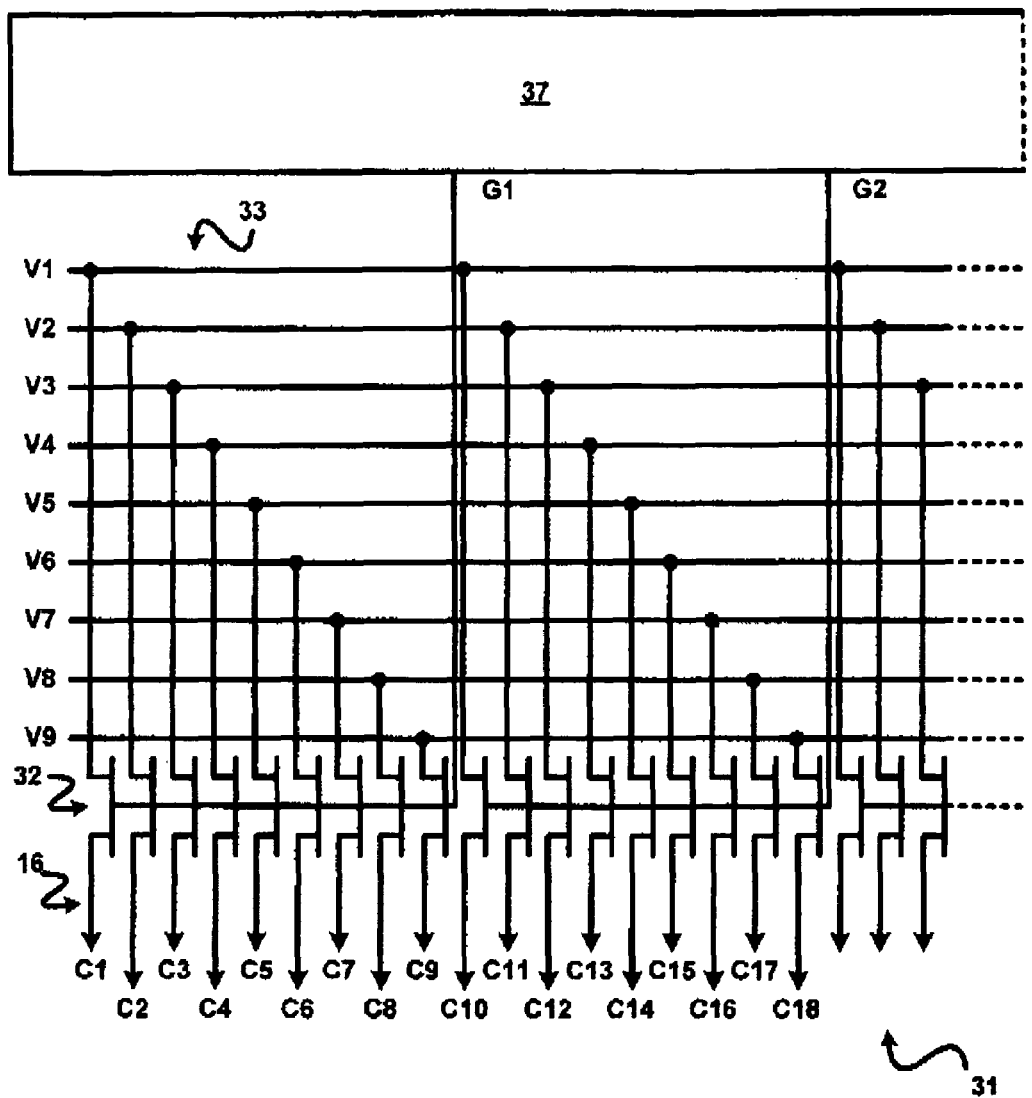

In the example of FIG. 2, there are nine parallel video input bus lines 33, V1 to V9, arranged physically in order corresponding to their number to which input video signals are applied in parallel, and the multiplexing switches, 32, are arranged in groups of nine with their outputs connected to respective and consecutive, ones of the column address conductors 16, C1–9, C10–18, etc. A control circuit 37, comprising a shift register, sequentially selects each of the groups of multiplexing switches by way of the control signals G1, G2, etc so that at the end of the row address period all the columns in the array have been charged. When G1 goes high the first nine multiplexer switches 32 close and the first nine columns C1 to C9 are charged to the voltage level on the video lines V1–V9 respectively. G1 then goes low, opening the nine associated multiplexer switches to isolate the columns C1 to C9 from the video lines. The voltages on the columns are then stored on the column capacitances. Next, the control signal G2 goes high, closing the next group of switches 32 and the second group of nine columns, C10 to C18, is charged to the voltages then existing on the respective video lines 33. The operation of the multiplexing circuit continues in this way with each group of columns being charged appropriately in succession until all the column conductors in the array have been charged in a respective row address period. Subsequent rows of display elements are addressed in similar manner in respective row address periods.

It is usual for the analog video signals required for the video bus lines 33 to be supplied from external circuitry, comprising, in the case of digital video signals being used, digital to analog converter circuits. However, and in accordance with one feature of the invention, the digital to analog converter circuits are also integrated, together with the multiplexing circuit 31, on the array substrate and comprise thin film circuit elements, i.e. TFTs, conductor lines, capacitors etc fabricated simultaneously with the active matrix array. An example of a digital to analog converter circuit suitable for this purpose is described in WO99/27653 (PHB 34210) although other known D/A converter circuits, such as switched capacitor type circuits, may be suitable as well. As is usual with such circuits, each D/A converter circuit includes an input latch circuit. The digital to analog converter circuits are arranged physically on the substrate as a set or series of respective blocks occupying substantially separate areas of the substrate, the number of such blocks corresponding to the number of video bus lines 33, (and column conductors in each group).

Figure 3:
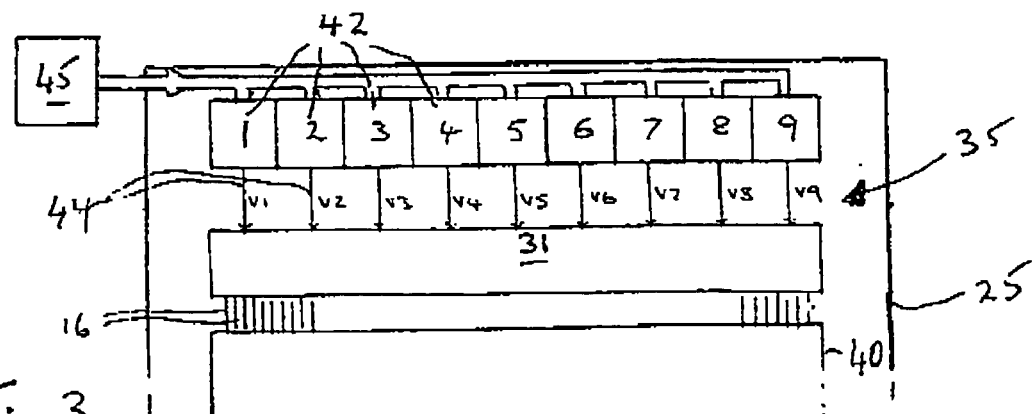
FIG. 3 illustrates diagrammatically a possible lay-out of drive circuit components in an AMLCD.

According to another feature of the invention, the order in which these blocks are arranged with respect to each other on the substrate and in relation to the video bus lines which they supply, and hence the order of the column conductors they serve, is such as to avoid potential problems with the quality of the display produced as will now be explained. For this purpose, reference is made to FIG. 3 which shows schematically one possible lay-out of the digital to analog converter circuit blocks in relation to the display element array and the multiplexing circuit. In FIG. 3, the display element array is denoted generally at 40 and the multiplexing circuit 31, including the video signal bus lines, extends generally parallel to, and alongside, one edge of the array with the individual outputs of the circuit 31 being connected to respective column conductors 16 in the array. The nine converter circuit blocks are indicated at 42 with the individual numbers (1–9) assigned thereto designating the respective number of the video bus line (V1–V9) with which they are associated. As shown, these blocks are arranged juxtaposed in a row generally parallel with the multiplexing circuit 31 and its video bus lines and adjacent an edge of the device substrate 25. Power supply, timing signals and video information signals are supplied to the blocks from an external timing and control circuit, here shown at 45, which also supplies power and timing signals to the multiplexing circuit 31. The blocks are ordered numerically and their respective outputs 44, along which the video signals V1 to V9 are supplied, are connected to the appropriate bus lines 33 in the multiplexing circuit 31 at regularly-spaced locations, corresponding to the block spacings, rather than to the ends of these lines. The individual circuit blocks 42 generally occupy discrete and respective regions of the substrate surface, although of course certain components such as clock and power lines will be shared between blocks. Referring also to FIG. 2, it will be appreciated that successive ones of the series of digital to analog circuit blocks supply respectively successively-numbered video bus lines 33, and hence successive column conductors in the groups, i.e. C1 to C9, C10 to C18, etc. Such an arrangement has been found to lead to problems with the display quality. The cause of this has been identified as slight-variations in the operation, and especially voltages generated in, different ones of the converter circuits due principally to the nature of the fabrication of the thin film elements constituting these circuits. A resultant variation in output voltage as supplied to the column conductors will tend to be greatest between converter circuit 1 and the converter circuit 9 in this example as these two converter circuits are spaced physically on the substrate 25 the furthest apart. These voltage variations can arise for a number of reasons but in general are due to variations in the operational characteristics of individual TFTs or dielectric layer thicknesses over the substrate, or from voltage losses along thin film signal lines feeding the converter circuits. Although the consequential variation of voltages tend to be the most significant with circuit blocks widely separated on the substrate, the variation in voltages produced in blocks physically closer together, and therefore whose thin film circuit elements are much less widely separated, will likely be minimal. Referring to FIG. 2, it will be appreciated that the signals generated by the converter circuits 1 and 9 will appear, via the signal bus lines V1 and V9, on immediately adjacent columns of the display, i.e. on the last column conductor of one group and the first column conductor of the next group, (e.g. column conductors C9 and C10, C18 and C19, etc). Thus, assuming a uniform display field is intended, a difference in voltages applied to these columns will show up as steps in output brightness from the display elements across the display, and repeating with a pitch equal to the number of columns in each group. Such brightness steps would be highly visible.

In order to reduce the visibility of the effect of such output voltage variations, and in accordance with a further feature of the invention, the lay-out of the converter circuits on the substrate is modified such that converter circuits which are to supply adjacent columns in the array are placed close together. The effect of this is to reduce the change in voltage which occurs moving from one column to the next, although the maximum voltage difference which can occur for columns in any one complete multiplexer group will be unchanged.

Figure 4:
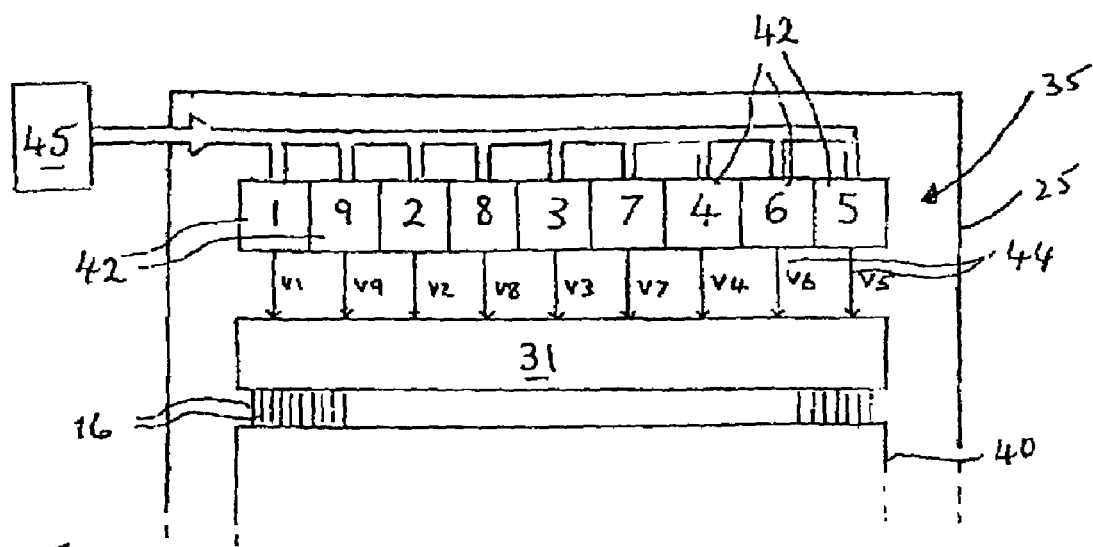
FIGS. 4 and 5 illustrate diagrammatically alternative lay-out arrangements for drive circuit components in accordance with the present invention.

FIG. 4 illustrates, for comparison with FIG. 3, the layout of the column drive circuit components in one embodiment according to the present invention. From this figure, it is seen that the nine converter circuit blocks 1 to 9 are again arranged in series in a line parallel to the multiplexing circuit 31 but that the blocks 42 are arranged in a different, and particular, numerical order. Thus, the converter circuit blocks 1 and 9 are arranged physically immediately adjacent one another. The other blocks 2 to 8 are similarly arranged physically on the substrate 25 to reduce the effects of voltage variations. Hence, block 2 is arranged between blocks 9 and 8, rather than being widely separated from these blocks as in the FIG. 3 arrangement, and so on. The complete sequence of the blocks, as shown in FIG. 4, is 1, 9, 2, 8, 3, 7, 4, 6 and 5, and it will be apparent that no two adjacent columns are therefore supplied with voltages from widely separated blocks.

Figure 5:
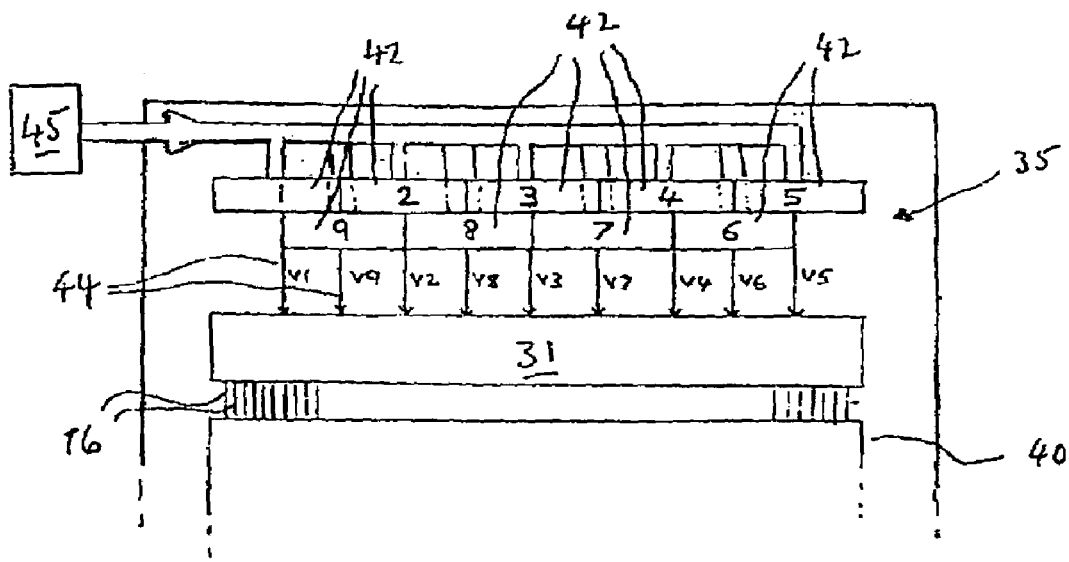

FIG. 5 illustrates schematically another possible arrangement of the column drive circuit components in accordance with the invention. This embodiment differs from the previous embodiment in that the converter circuit blocks 42 are laid out instead in two rows and with the blocks in one row being offset from those in the other in brick-like fashion but with the numerical order of the overlapping blocks in the direction of the rows being the same as before. In this case, the circuits blocks associated with some pairs of adjacent column conductors lie even closer together. The arrangement allows each block to occupy more space in the row direction, although a greater overall space in the column direction is required to accommodate the two rows of blocks.

With regard to the arrangements of FIGS. 4 and 5, then the lay-outs of the blocks 42 in both cases is such that differences in voltages generated in the video bus lines which connect to successive columns is as small as possible. The possibility of large voltage variations occurring from one column to the next is avoided. The more gradual change in voltage which can still occur over a number of columns is far less noticeable.

Although the above-described example of display device utilises digital video signals supplied to the column drive circuit 35 and the circuit blocks 42 comprise digital to analog converter circuits, each including an input latch circuits, the same technique is applicable to other kinds of column drive circuit which supply the necessary signals for the plurality of video bus lines in the multiplexing circuit. Thus, the column drive circuit may be of a type to which analog video information is applied instead, in which case each of the circuit blocks 42 can comprise a sample and hold circuit with buffer amplifier, or other known form of analog video signal processing circuit suitable for the required purpose.

While the converter circuit blocks have been shown as arranged parallel to the multiplexing circuit between an edge of the display element array and an edge of the substrate 25, the same principles can be applied in the case where the circuits are located elsewhere on the substrate, for example closer to region where the externally provided video signal is supplied to the substrate. The blocks 42 could be arranged other than linearly in one or more rows. If the region of the substrate available to accommodate the circuit blocks allows, the blocks could be arranged in a square pattern or even in a curved line.

In the described embodiments, the column drive circuit 35 for the array comprises a single unit. However, and particularly if there is a relatively large number of column conductors to address, the column drive circuit may effectively be split into two separate (sub-) circuits, each of which would be similar to the previously described drive circuit 35 but addressing just one half of the set of column conductors, and with the two circuits operating simultaneously in parallel and generally independently, although controlled appropriately by the timing and control unit 45. By using separate column drive circuits in this manner, each with its separate set of video bus lines, faster operation becomes possible and problems due to the lengths of the video bus lines and their resistance are reduced since their individual lengths are now much shorter, for example corresponding approximately to half the row length.

In a colour display device, then assuming the pixels are arranged in RGBRGB etc. order in a row, the video signal bus lines V1 to V9 can supply red, green, blue, red, green, blue, etc. colour information, in which case the blocks 42 in the FIG. 4 example would, starting at the left, operate with red, blue, green, green, blue, red, etc colour information respectively.

The active matrix display device may be of a type using display elements other than LC display elements for example, electroluminescent or electro-chromic display elements.

The invention is applicable also to other kinds of active matrix array devices in which it would be desirable to integrate more of the addressing circuitry, such as sensor array devices in which matrix sensing elements comprise, for example, optical sensing elements as in image sensing array devices, or pressure or capacitive sensing elements as in touch or fingerprint sensing array devices, and in which the matrix array of sensing elements are similarly addressed via sets of row and column conductors. Typical examples of an image sensing device and fingerprint sensing device are described in EP-A-0569090 and U.S. Pat. No. 5,325,442 respectively. In these types of devices, each row of the matrix elements is selected via an associated address conductor of one set and data from the elements of the selected row, usually in the form of electrical charges, is read out via respective conductors of the other set. The conductors of this other set can be coupled to a multiplexing circuit similar to that of FIG. 2 and with the bus lines connected to respective associated sense amplifiers responsive to the element outputs. The sense amplifiers can be integrated, together with the multiplexing circuit, on the same substrate as the array of sense elements, and fabricated, using thin film technology, simultaneously with the sense element array, and with the individual sense amplifier circuit blocks being laid-out in the manner described to avoid problems caused by variation in the operational characteristics of the sense amplifier circuits which are situated further apart.

From reading the present disclosure, other modifications will be apparent to persons skilled in the art. Such modifications may involve other features which are already known in the field of active matrix array devices and component parts thereof and which may be used instead of or in addition to features already described herein.

The invention claimed is:

1. An active matrix array device, comprising:
   a substrate;
   an army of individually addressable matrix cements carried on said substrate;
   a set of address conductors connected to said array of matrix elements and carried on group including successive address conductors; and
   an addressing circuit including
      a multiplexing circuit integrated on said substrate and connected to said set of address conductors, said multiplexing circuit including a plurality of signal bus lines, said multiplexing circuit being arranged to couple sequentially each group of said set of address conductors to said plurality of signal bus lines with each address conductor in a group being coupled to a respective one of said signal bus lines, and
      a plurality of signal processing circuits integrated on said substrate, each signal processing circuit being connected to a respective bus line, wherein a first signal processing circuit associated with a first address conductor of a first group of address conductors and a second signal processing circuit associated with a last address conductor of a second group of address conductors are adjacent on said substrate.

2. The active matrix array device of claim 1, wherein said signal processing circuits are arranged in series in a line parallel to said multiplexing circuit.

3. The active matrix array device of claim 1, wherein a first subset of said signal processing circuits are arranged in a first row and a second subset of said signal processing circuits are arranged in a second row and offset from the first row in a brick-like fashion.

4. The active matrix array device of claim 1, wherein an order in which said signal processing circuits are arranged physically on said substrate is different than a physical order of said signal bus lines to which said signal processing circuit blocks are respectively connected.

5. An active matrix array device, comprising:
   a substrate;
   an array of individually addressable matrix elements carried an said substrate;
   a set of address conductors connected to said army of matrix elements and carried on said substrate, said set of address conductors being arranged in a series of groups with each group including successive address conductors; and
   an addressing circuit including
      a multiplexing circuit integrated on said substrate and connected to said set of address conductors, said multiplexing circuit including a plurality of signal bus lines, said multiplexing circuit being arranged to couple sequentially each group of said set of address conductors to said plurality of signal bus lines with each address conductor in a group being coupled to a respective one of said signal bus lines, and
      a plurality of signal processing circuits integrated on said substrate, each signal processing circuit being connected to a respective bus line, wherein an order in which said signal processing circuits are arranged physically on said substrate is at least partially different than a physical order of said signal bus lines to which said signal processing circuit blocks are respectively connected.

* * * * *